(12) United States Patent
Nagasaka et al.

(10) Patent No.: US 7,098,991 B2
(45) Date of Patent: Aug. 29, 2006

(54) EXPOSURE METHOD, EXPOSURE APPARATUS, AND METHOD FOR MANUFACTURING DEVICE

(75) Inventors: Hiroyuki Nagasaka, Kumagaya (JP); Takashi Aoki, Kawasaki (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/957,639

(22) Filed: Oct. 5, 2004

(65) Prior Publication Data

US 2005/0117134 A1   Jun. 2, 2005

Related U.S. Application Data

(63) Continuation of application No. PCT/JP03/04515, filed on Apr. 9, 2003.

(30) Foreign Application Priority Data

Apr. 9, 2002 (JP) .............................. 2002-106783

(51) Int. Cl.
   *G03B 27/42* (2006.01)
(52) U.S. Cl. ...................... 355/53; 355/72; 355/75; 250/492.2
(58) Field of Classification Search ..................... None
   See application file for complete search history.

(56) References Cited

U.S. PATENT DOCUMENTS 5,715,064 A * 2/1998 Lin .............................. 356/401
5,997,963 A    12/1999 Davison et al.
6,757,048 B1 * 6/2004 Arakawa ...................... 355/30
2001/0015795 A1 * 8/2001 Nishi ........................... 355/53
2002/0057423 A1   5/2002 Nogawa
2003/0169407 A1 * 9/2003 Hasegawa et al. ............ 355/30

FOREIGN PATENT DOCUMENTS

| JP | A 2001-284224 | 10/2001 |
| JP | A 2002-513856 | 5/2002 |
| JP | A 2002-258154 | 9/2002 |
| KR | 2001-0071202 | 7/2001 |
| TW | 429395 B | 4/2001 |
| WO | WO 99/57331 | 11/1999 |

* cited by examiner

Primary Examiner—D. Rutledge
(74) Attorney, Agent, or Firm—Oliff & Berridge PLC

(57) ABSTRACT

According to one embodiment of the invention, a pattern of a mask is transferred onto a substrate via a projection optical system using an energy beam by placing a substrate on side of an energy beam emitting end portion of projection optical system, when the substrate is exposed, and placing an object on the side of the energy beam emitting end portion of the projection optical system in place of the substrate when the substrate is exchanged. This can adequately remove a light absorptive substance from the region near an output end of the projection optical system and can maintain the gas state even at a time of moving or replacing the substrate.

35 Claims, 11 Drawing Sheets

EXHAUST

EXHAUST

EXPOSURE METHOD, EXPOSURE APPARATUS, AND METHOD FOR MANUFACTURING DEVICE

This is a Continuation of Application No. PCT/JP03/04515 filed Apr. 9, 2003. The entire disclosure of the prior application is hereby incorporated by reference herein in its entirety.

TECHNICAL FIELD

The present invention relates to an exposure method, an exposure apparatus, and a method for manufacturing a device for manufacturing electronic devices, such as semiconductor devices, liquid crystal display devices, image pickup devices (CCD or so) and thin film magnetic heads.

BACKGROUND ART

In manufacturing electronic devices, such as semiconductor devices and liquid crystal display devices, in a photolithography process, a projection exposure apparatus is used which projects a pattern image of a mask or reticle (hereinafter called "reticle") having a pattern formed thereon on each projection (shot) area on a substrate which is coated with a photosensitive agent (resist) via a projection optical system. Circuits of an electronic device are transferred by exposing a circuit pattern on a substrate to be exposed by the projection exposure apparatus, and formed in a post-process.

Recently, large scale integration of integrated circuits or miniaturization of circuit patterns are in progress. In this respect, the wavelength of illumination light for exposure (hereinafter called "exposure light") to be used in the projection exposure apparatus tend to become shorter. That is, a light source of a short wavelength, such as a KrF excimer laser (wavelength: 248 nm) is taking the place of a mercury lamp that has been popular, and an ArF excimer laser (193 nm) is coming to the last stage of the practical use. Exposure apparatuss that use an $F_2$ laser (157 nm) are being developed to achieve higher integration.

Beams having a wavelength of about 190 nm or shorter belong to a vacuum ultraviolet region and do not pass through the air. This is because a substance, such as oxygen molecules, hydrogen molecules or carbon dioxide molecules, present in the air (hereinafter called "light absorptive substance") absorbs the energy of the beam.

In an exposure apparatus using exposure light of the vacuum ultraviolet region, it is necessary to reduce or eliminate the light absorptive substance from the space of the optical path of the exposure light for the exposure light to reach a substrate to be exposed with sufficient illumination. For this purpose, it is often the case where in the exposure apparatus, the space above the optical path is surrounded by a casing and the space inside the casing is filled with a permeable gas which passes exposure light. In this case, given that the total optical path length is 1000 mm, for example, the density of the light absorptive substance in the space of the optical path is practically is equal to or less than 1 ppm or so.

As a substrate is frequently replaced in the exposure apparatus, however, it is difficult to eliminate the light absorptive substance from the space between the projection optical system and the substrate in the space of the optical path. For instance, while it is preferable to set a casing large enough to surround even a mechanism for substrate replacement, the consumption amount of gas to be filled in the casing becomes larger as the casing becomes larger in this case.

In this respect, there is a case where an exposure apparatus uses a technique of removing a light absorptive substance from the space of the optical path by blowing a permeable gas, which passes exposure light, on the exit portion of the projection optical system. This technique is described in, for example, Japanese Patent Laid-Open Publication No. H6-260385.

As the blown gas is likely to leak around a substrate according to the technique, however, the leaked permeable gas may affect peripheral system. For example, an exposure apparatus often employs an interferometer system using a laser beam in order to control a stage where a substrate is to be mounted. When a permeable gas enters the optical path of the interferometer, however, the difference between refractive indexes of a gas (air) which has been present on the interferometer optical path so far and the light absorptive substance changes the optical path length of the laser beam, which may lower the control precision of the interferometer system.

When a substrate is placed on the exit portion of the projection optical system, the substrate becomes a part of the partition to suppress the gas leakage, but when the substrate moves or the substrate is replaced, at least a part of the substrate which becomes the partition comes off the exit portion of the projection optical system, so that the gas state on the exit portion of the projection optical system is not kept and the gas leakage is likely to occur.

The invention has been made in consideration of the above-described situations, and aims at providing an exposure method and an exposure apparatus which can adequately remove a light absorptive substance from the exit portion of the projection optical system and can keep the gas state even at the time of moving or replacing a substrate.

It is another object of the invention to provide a device manufacturing method which can improve the pattern precision.

DISCLOSURE OF INVENTION

References and reference numerals in parentheses given in the following description merely indicate the relationship between the structures of embodiments to be discussed later and individual elements and do not limit the individual elements to the structures of the embodiments.

An exposure method for transferring a pattern of a mask onto a substrate via a projection optical system using an energy beam comprises the steps of placing a substrate on side of an energy beam emitting end portion of projection optical system, when the substrate is exposed, and placing an object on the side of the energy beam emitting end portion of the projection optical system in place of the substrate when the substrate is exchanged According to the exposure method, a light absorptive substance is removed from the optical path of the projection optical system by filling the exit portion of the projection optical system with the permeable gas with the substrate serving as a part of a partition. At the time of moving the substrate or replacing the substrate, an object is placed on the exit portion of the projection optical system so that the object becomes a part of the partition in place of the substrate. Accordingly, even at the time of moving or replacing the substrate, leakage of the permeable gas from the exit portion of the projection optical system is suppressed, so that the gas state in which the light absorptive substance on the exit portion of the projection optical system has been removed is maintained.

The exposure method can be executed by an exposure apparatus for transferring a pattern of a mask (R) onto a substrate (W) via a projection optical system (PL) using an energy beam (IL) which comprises a gas supply system which supplies space between the substrate (W) and a exit portion of the projection optical system (PL) with a permeable gas which passes the energy beam (IL), and an object which is placed on the exit portion of the projection optical system (PL) in place of the substrate (W) at a time of moving the substrate (W) or replacing the substrate (W) in order to keep a gas state on the exit portion of the projection optical system (PL).

It is preferable that the object is placed in such a way that a distance to the projection optical system (PL) becomes nearly equal to the distance between the object and the substrate (W). This surely keeps the gas state on the exit portion of the projection optical system.

It is preferable that the object is placed so as to form a surface which is continuous with a surface of the substrate (W). This suppresses the staying of the gas or disturbance of the gas flow, and keeps the gas state on the exit portion of the projection optical system more surely.

It is acceptable if the object is a part of a substrate (W) stage which holds the substrate (W). As the object is a part of the substrate stage, the object takes the same motion as the substrate at the time the substrate moves, it becomes easy to keep the gas state.

It is acceptable if the exposure apparatus may further comprise a driving unit which moves the object. In this case, it is possible to change the layout state of the object to a desired state at the time of moving or replacing the substrate or the like.

In this case, it is acceptable if the driving unit moves the object so as to open and close a supply port for the permeable gas. By setting the supply port to a closed state when the permeable gas is unnecessary, leakage of the permeable gas can be prevented surely.

It is acceptable that, in the exposure apparatus, at a time of replacing the substrate (W), the driving unit drives the object so as to come close to the substrate (W), and after that, the driving unit drives the object and the substrate (W) in a close state to place the object near the exit side of the projection optical system (PL). Making the substrate and the object come close to each other allows the object and the substrate together to become a part of the partition on the exit portion of the projection optical system. As the object and the substrate are moved in that close state, the state of the partition is maintained, even during the movement, thereby keeping the gas state on the exit portion of the projection optical system.

It is acceptable that the exposure apparatus further comprises a plurality of substrate (W) stages which hold the substrate (W) such that at a time of replacing the substrate (W), the plurality of substrate (W) stages come close to one another, and after that, the plurality of substrate (W) stages move in a close state to place a next substrate (W) on the exit portion of the projection optical system (PL). In this case, as the plural substrate stages are made to come close to one another, they together become a part of the partition on the exit portion of the projection optical system. At the time of replacing the substrate, moving plural stages in the close state keeps the state of the partition even during movement, thus keeping the gas state on the exit portion of the projection optical system.

According to the present invention, an exposure method for transferring a pattern of a mask (R) onto a substrate (W) via a projection optical system (PL) using an energy beam (IL) comprises the steps of filling a space between the substrate (W) and a exit portion of the projection optical system (PL) with a permeable gas which passes the energy beam (IL), and discharging a gas including the permeable gas from around the substrate (W) via an exhaust port which moves together with the substrate (W).

According to the exposure method, a light absorptive substance is removed from the optical path of the projection optical system by filling the exit portion of the projection optical system with the permeable gas with the substrate serving as a part of a partition. Leakage of the permeable gas to around a wafer at the time of moving the wafer by discharging a gas including the permeable gas from around the wafer via the exhaust port that moves together with the substrate.

The exposure method is executed by an exposure apparatus for transferring a pattern of a mask (R) onto a substrate (W) via a projection optical system (PL) using an energy beam (IL) which comprises a gas supply system which supplies a permeable gas which passes the energy beam (IL) to a space between the substrate (W) and a exit portion of the projection optical system (PL), and an exhaust port which moves together with the substrate (W) so as to discharge a gas including the permeable gas from around the substrate (W).

In this case, it is preferable that the exhaust port is disposed at a substrate (W) stage which holds the substrate (W). By doing this, the exhaust port takes the same motion as the substrate, so that even at the time the substrate moves, it is possible to easily maintain the discharge state.

According to the present invention, an exposure method for transferring a pattern of a mask (R) onto a substrate (W) via a projection optical system (PL) using an energy beam (IL) comprises the steps of filling a space between the substrate (W) and a exit portion of the projection optical system (PL) with a permeable gas which passes the energy beam (IL), placing an exhaust port near the exit side of the projection optical system (PL) in place of the substrate (W) at a time of moving the substrate (W) or replacing the substrate (W), and discharging a gas including the permeable gas via the exhaust port.

According to the exposure method, a light absorptive substance is removed from the optical path of the projection optical system by filling the exit portion of the projection optical system with the permeable gas with the substrate serving as a part of a partition. Leakage of the permeable gas to around a wafer at the time of moving or replacing the wafer by placing the exhaust port on the exit portion of the projection optical system in place of the substrate at the time of moving the substrate or at the time of replacing the substrate and discharging a gas including the permeable gas.

The above exposure method can be performed by an exposure apparatus for transferring a pattern of a mask (R) onto a substrate (W) via a projection optical system (PL) using an energy beam (IL) which comprises a gas supply system which supplies a permeable gas which passes the energy beam (IL) space between the substrate (W) and a exit portion of the projection optical system (PL), and an exhaust port which is placed on the region near the exit side of the projection optical system (PL) in place of the substrate (W) at a time of moving the substrate (W) or replacing the substrate (W) so as to discharge a gas including the permeable gas via the exhaust port.

A method according to the present invention for manufacturing a device comprises the steps of transferring a device pattern which is formed on the mask (R) onto the substrate (W) by using the above explained exposure apparatus.

The device manufacturing method prevents reduction in control precision by leakage of the permeable gas in the exposure apparatus, thus making it possible to improve the pattern precision.

BEST MODE FOR CARRYING OUT THE INVENTION

The first embodiment of an exposure apparatus according to the invention will be described below with reference to the accompanying drawings. In the embodiment, the invention is adapted to a step and scan type projection exposure apparatus which uses vacuum ultraviolet rays as an exposure energy beam. It is to be noted that the invention is not limited to the following individual embodiments, and, for example, the components of these embodiments may be combined adequately.

Figure 1:
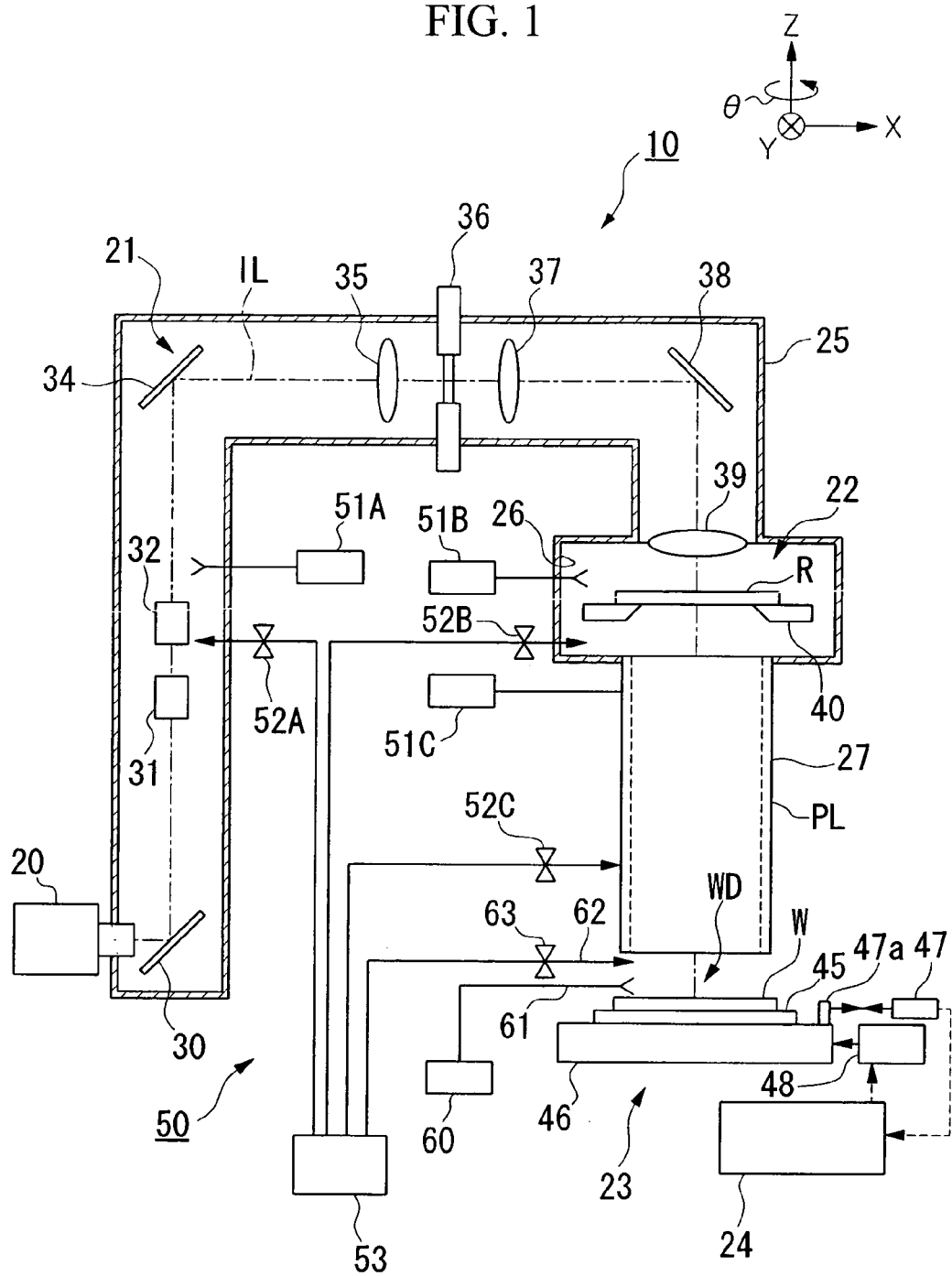
FIG. 1 is a view for showing a structure for a first embodiment of an exposure apparatus according to the invention.

FIG. 1 is a partly cutaway structural diagram illustrating the schematic structure of an exposure apparatus 10 according to the embodiment, and in FIG. 1, the mechanism portion of the exposure apparatus of the embodiment is roughly separated into an illumination optical system 21, a reticle manipulation section 22, a projection optical system PL and a wafer manipulation section 23. The illumination optical system 21, the reticle manipulation section 22 and the projection optical system PL are respectively accommodated in an illumination chamber 25, a reticle chamber 26 and a barrel 27 each of a box shape, isolated from the outside air (a gas inside a chamber to be discussed later) with an improved sealing condition. The exposure apparatus 10 of the embodiment as a whole is accommodated in a large chamber (not shown) with the temperature of a gas inside being controlled to lie within a predetermined target range.

In the illumination optical system 21, an $F_2$ laser light source which generates a pulse laser beam with a wavelength of 157 nm of the vacuum ultraviolet region is used as an exposure light source 20, and the exit side of the exposure light source 20 is attached to the lower portion of the illumination chamber 25. At the time of exposure, exposure light IL (energy beam) emitted from the exposure light source 20 into the illumination chamber 25 is reflected upward by a mirror 30 and is incidence to a fly-eye lens 32 as an optical integrator (homogenizer) via an unillustrated auto tracing section which corrects the shafting of the optical axis caused by vibration or so and a beam shaping optical system 31 which performs shaping of the cross-sectional shape of the illumination system and light quantity control. An aperture stop (not shown) is located at the exit surface of the fly-eye lens 32, and the exposure light IL, output from the fly-eye lens 32 and having passed the aperture stop, is reflected nearly in the horizontal direction by a mirror 34 and reaches a field stop (reticle blind) 36 via a relay lens 35.

The layout surface of the field stop 36 is optically in conjugation with the pattern surface of a reticle R to be exposed, and has a fixed blind which defines the shape of an elongated rectangular illumination area on the pattern surface and a movable blind which closes the illumination area to prevent exposure of an unnecessary portion at the time of starting and ending scan exposure. The exposure light IL which has passed the field stop 36 illuminates the rectangular (slit-like) illumination area on the pattern surface of the reticle R with a uniform illumination distribution via a relay lens 37, a mirror 38 and a condenser lens system 39 fixed to the end portion of the illumination chamber 25. The exposure light source 20 to the condenser lens system 39 constitute the illumination optical system 21, and the optical path of the exposure light IL in the illumination optical system 21, i.e., the optical path from the exposure light source 20 to the condenser lens system 39 is sealed by the illumination chamber 25.

Under the exposure light IL from the illumination optical system 21, the image of the pattern in the illumination area of the reticle R is projected on a wafer W coated with a photosensitive agent (photoresist) with a projection magnification $\beta$ ($\beta$ being, for example, 1/4, 1/5, etc) via the projection optical system PL. The wafer W is a disk-shaped substrate of, for example, a semiconductor (silicon or so) or SOI (silicon on insulator) or the like.

When the exposure light IL is an $F_2$ laser beam as in the embodiment, an optical glass material with a good transmittance is limited to fluorite (crystal of $CaF_2$), quartz glass doped with fluorine or hydrogen or the like, and magnesium fluoride ($MgF_2$) or the like, so that it is difficult to acquire the desired image forming characteristic (chromatic aberration characteristic or so) with the projection optical system PL if comprised only of a refraction optical member. In this respect, the projection optical system PL in the embodiment employs catadioptric system which is a combination of a refraction optical member and a reflector. A description will be given below with the X axis taken in the direction intersecting the optical axis AX of the projection optical system PL and the Y axis taken perpendicular to the sheet surface of FIG. 1. The illumination area on the reticle R in the embodiment is a rectangle elongated in the X direction, and the scan direction of the reticle R and the wafer W at the time of exposure is the Y direction.

In the reticle manipulation section 22, the reticle R is held on a reticle stage 40. The reticle stage 40 continuously moves the reticle R in the Y direction in synchronism with a wafer stage to be discussed later on an unillustrated reticle base, and drives the reticle R minutely in such a way as to reduce a synchronization error in the X direction, the Y direction and the rotational direction. The position and rotational angle of the reticle stage 40 are measured with a high accuracy by an unillustrated laser interferometer, and the reticle stage 40 is driven based on the measurements and control information from a main control system 24 comprising a computer, which performs the general control of the operation of the overall apparatus. The reticle stage 40 and the unillustrated reticle base, reticle loader, etc. constitute the reticle manipulation section 22, and the optical path of the exposure light IL in the reticle manipulation section 22, i.e., the optical path from the condenser lens system 39 to the projection optical system PL is sealed by the reticle chamber 26.

In the projection optical system PL, a plurality of optical members (optical elements) are retained, sealed in the barrel 27, the optical path from the optical member on the reticle side of the projection optical system PL to the optical member on the wafer side is sealed in the barrel 27.

In the wafer manipulation section 23, the wafer W is chucked and held on the mounting surface of a wafer holder 45, which is fixed onto a wafer stage 46. The wafer stage 46 continuously moves the wafer W in the Y direction in synchronism with the aforementioned reticle stage on an unillustrated wafer base and makes a step movement of the wafer W in the X direction and the Y direction. The wafer stage 46 focuses the surface of the wafer W on the image surface of the projection optical system PL in an auto focus system based on information about the position of the top surface of the wafer W in the direction of the optical axis AX (focus position) measured by an unillustrated auto focus sensor. The positions of the wafer stage 46 in the X direction and the Y direction and the rotational angle about the X axis (pitching amount), the rotational angle about the Y axis (rolling amount) and the rotational angle about the Z axis (yawing amount) are measured with a high precision by a laser interferometer 47, and the wafer stage 46 is driven via a stage drive system 48 based on the measurements and control information from the main control system 24. A moving mirror 47a, which is attached to the wafer stage 46 (wafer holder 45) and reflects the laser beam (measuring beam) from the laser interferometer 47, can take various structures, such as a structure comprised of separate prism-shaped mirrors, a structure comprised of an integrated L-shaped mirror, and a structure where the side surface of the wafer stage (wafer holder) is mirror-processed to be used as a mirror. The wafer holder 45, the wafer stage 46 and the wafer base, etc. constitute the wafer manipulation section 23, and a wafer loader or the like (not shown) as a conveyance system is located at the side of the wafer manipulation section 23.

As the exposure light IL in the embodiment is vacuum ultraviolet rays with a wavelength of 157 nm, light absorptive substances for the exposure light IL are oxygen ($O_2$), water (water vapor: $H_2O$), carbon oxide (CO), carbonic-acid gas (carbon dioxide: $CO_2$), an organic substance and a halide or the like. As gases through which the exposure light IL passes (substance which hardly absorbs energy), there are a nitrogen gas ($N_2$) and rare gases comprised of hydrogen ($H_2$), helium (He), neon (Ne), argon (Ar), krypton (Kr), xenon (Xe), and radon (Rn). Hereinafter, the nitrogen gas and rare gases will be called "permeable gas".

The exposure apparatus of the embodiment has a gas supply/discharge system 50, which supplies and fills the space of the optical path, i.e., inside the illumination chamber 25, the reticle chamber 26 and the barrel 27, with the permeable gas that has low energy absorption with respect to a beam of the vacuum ultraviolet region, and sets the pressure to about the same as or higher than the atmospheric pressure (e.g., high within the range of 0.001 to 10% with respect to the atmospheric pressure. The gas supply/discharge system 50 includes discharge vacuum pumps 51A, 51B and 51C, a bomb 53 where the permeable gas is retained in a compressed or liquidated form in a highly pure state, and valves 52A, 52B and 52C whose opening and closing are controlled. Their quantities and set locations are not limited to those illustrated. The nitrogen gas works as a light absorptive substance with respect to light with a wavelength of about 150 nm or lower, and the helium gas can be used as a permeable gas up to the wavelength of 100 nm or so. Because the helium gas has a thermal conductance about 6 times the thermal conductance of the nitrogen gas, and a change in its refractive index with respect to a change in pressure is about ⅛ of that of the nitrogen gas, the helium gas is excellent particularly in a high transmittance, the stability of the image forming characteristic of the optical system and the cooling property. Because the helium gas is expensive, the nitrogen gas may be used as the permeable gas in order to reduce the operational cost if the wavelength of the exposure light is equal to or higher than 160 nm like the $F_2$ laser.

Figure 2:
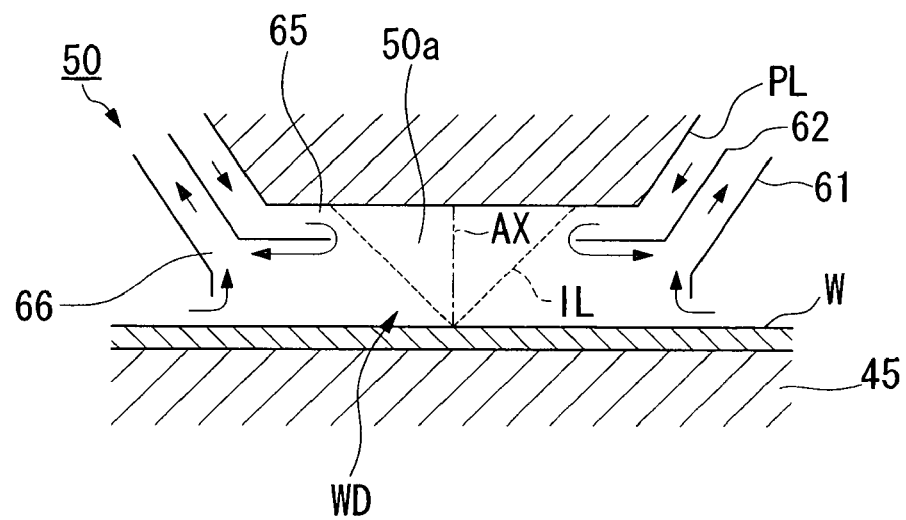
FIG. 2 is a side view for showing a structure near a working distance section in the first embodiment.

In the embodiment, a local purge mechanism, which is formed by the gas supply/discharge system 50, is laid out in space between the end portion of the projection optical system PL and the wafer W as a wording distance section WD. The local purge mechanism supplies the permeable gas to the space between the end portion of the projection optical system PL and the wafer W and removes a light absorptive substance from the optical path. That is, the gas supply/discharge system 50 has a discharge vacuum pump 60, a discharge pipe 61, a gas supply pipe 62 and a vale 63, etc. for the working distance section WD. FIG. 2 exemplarily showing the situation as seen from near the working distance section WD.

As shown in FIG. 2, a gas supply port 65 of the gas supply pipe 62 is laid out in the working distance section WD in such a way as to surround the optical axis AX of the projection optical system PL, and an exhaust port 66 of the discharge pipe 61 is laid outside it. The gas supply port 65 is provided in an annular form in such a way as to surround the optical axis AX, and the exhaust port 66 is located on the wafer W side as compared with the gas supply port 65 and is provided in an annular form in such a way as to surround the working distance section WD. In the embodiment, the amount of discharge from the exhaust port 66 is set greater than the supply amount of the permeable gas from the gas supply port 65.

In the working distance section WD having the gas supply port 65 and the exhaust port 66, the permeable gas is supplied via the gas supply port 65 and a gas including the permeable gas is discharged through the exhaust port 66. The gas supply and discharge fills the working distance section WD with the permeable gas with the end portion of the projection optical system PL and the wafer W being a part of a partition. That is, a first partition is formed between the end portion of the projection optical system PL and the wafer W by the gas supply pipe 62 and the gas discharge pipe 61. An opening 50*a* for passing the exposure light is formed in the first partition, and the wafer W is placed near the opening of the first partition in such a way that the wafer W as a second partition closes the opening of the first partition. The permeable gas is filled inside the first partition. The light absorptive substance present in the working distance section WD and a gas which tries to newly enter the working distance section WD via the space between the wafer W and the gas discharge pipe are discharged together with the permeable gas through the exhaust port 66. The gas supply/discharge system 50 discharges the gas including the permeable gas more than the supply amount of the permeable gas from outside the gas supply port 65 with respect to the working distance section WD. Accordingly, the light-absorptive-substance removed state is maintained in the working distance section WD and the permeable gas supplied from the gas supply port 65 is surely discharged, thus preventing leakage of the permeable gas to the periphery.

Figure 3:
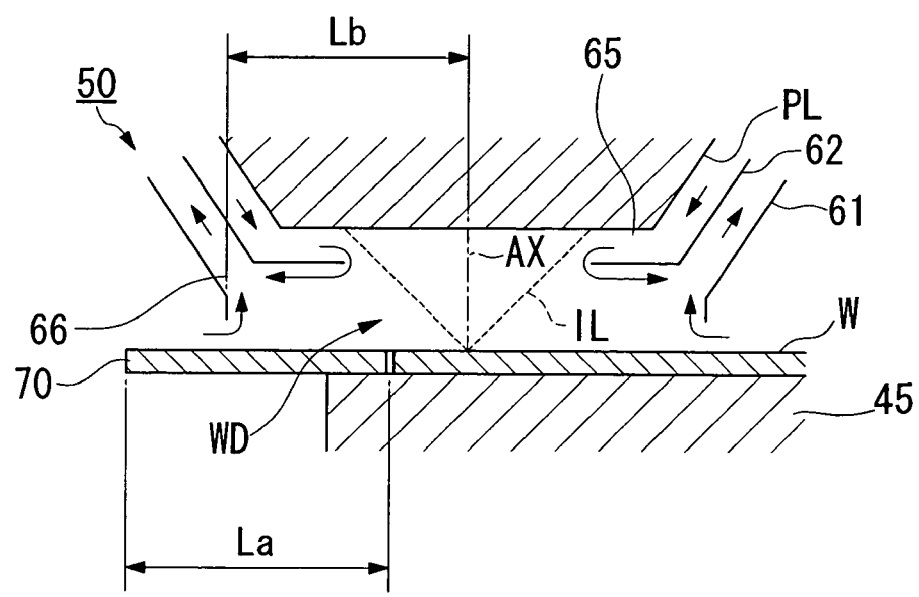
FIG. 3 is a view for showing a working distance section under condition that periphery of the end portion of a wafer is exposed.

FIG. 3 is a view showing working distance section WD at the time of exposing a vicinity of the edge portion of the wafer W. As shown in FIG. 3, in the exposure apparatus of the embodiment, an object (member 70) is placed on the exit portion of the projection optical system PL at the time of exposing the vicinity of the end portion of the wafer W, and with the object being a part of the partition (second partition), the gas state on the side of the end portion of the projection optical system PL is maintained. In other words, the interior of the first partition is maintained in such a way that it is always filled with permeable gas. In the example shown in FIG. 3, a member 70 having a side extending outward from near the peripheral edge of the wafer W is used as the object, and the member 70 is secured as a part of the wafer stage 46 to the wafer holder 45. The height of the surface (top surface) of the member 70 is set at nearly the same height as the wafer W in such a way that the distance to the projection optical system PL becomes approximately the same as that to the wafer W. In case of exposing near the edge portion of the wafer W, as the wafer W moves in the direction crossing the optical axis AX, the member 70 moves. When the edge of the wafer W is positioned on the side of the exit portion of the projection optical system PL, the member 70 is positioned on the side of the end portion of the projection optical system PL. This positioning causes the member 70 to become a part of the partition in the working distance section WD in place of the wafer W or complementarily, so that the leakage of the permeable gas from the side of the end portion of the projection optical system PL is suppressed, keeping the gas state in the working distance section WD.

As shown in FIG. 3 the extending length, La, of the member 70 from the edge of the wafer W is set in such a way that the end portion of the member 70 is positioned outward of the exhaust port 66 in the gas supply/discharge system 50. That is, the extending length La is set longer than the distance, Lb, of the exhaust port 66, provided annularly, from the optical axis, and is set to, for example, about the same as the radial length of the wafer W. Accordingly, even when the wafer W moves at the time of exposure, the wafer W or the member 70 is always positioned under the exhaust port 66 so that the gas supply and discharge are adequately carried out with the wafer W or the member 70 being the second partition.

Figure 4:
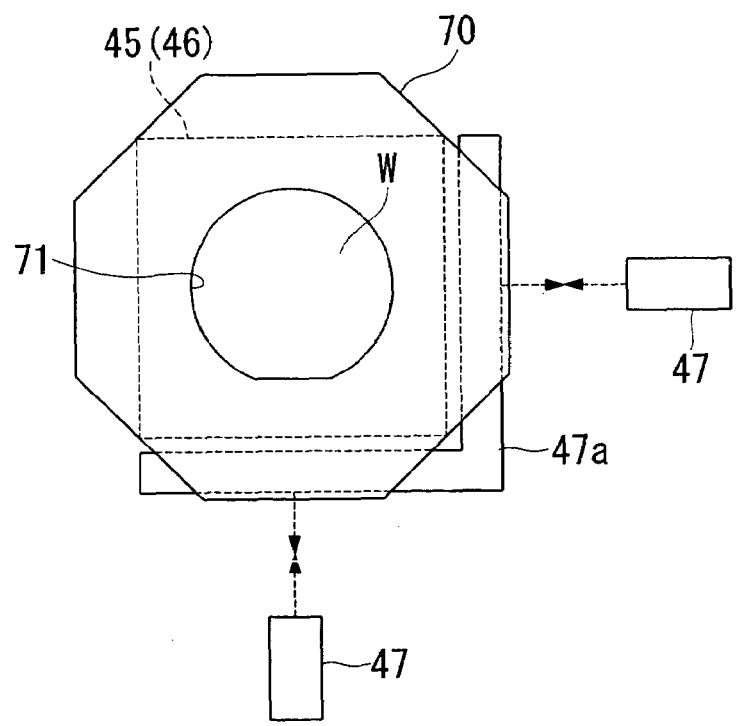
FIG. 4 is a plan view schematically showing a mode example of a member to be secured to a wafer holder.

FIG. 4 is a plan view schematically showing a mode example of the member 70. As shown in FIG. 4, the member 70 has an opening 71 with approximately the same shape as the wafer W, and is secured onto the wafer holder 45 in such a way as to form a surface which is contiguous with the surface of the wafer W. As the wafer stage 46 (wafer holder 45) moves at a high acceleration, it is preferable that the member 70 should be light and formed into a shape which has a low air resistance at the time it moves. The member 70 in the embodiment is made of a thin plate-like member and a light metal such as aluminum is used for its material. The material of the member 70 is not limited to a light metal such as aluminum but various kinds such as other metals or a resin can be used. Although the member 70 is formed in a polygonal shape in the example shown in FIG. 4, which is not restrictive, it can take other shapes, such as a circle.

Figure 5:
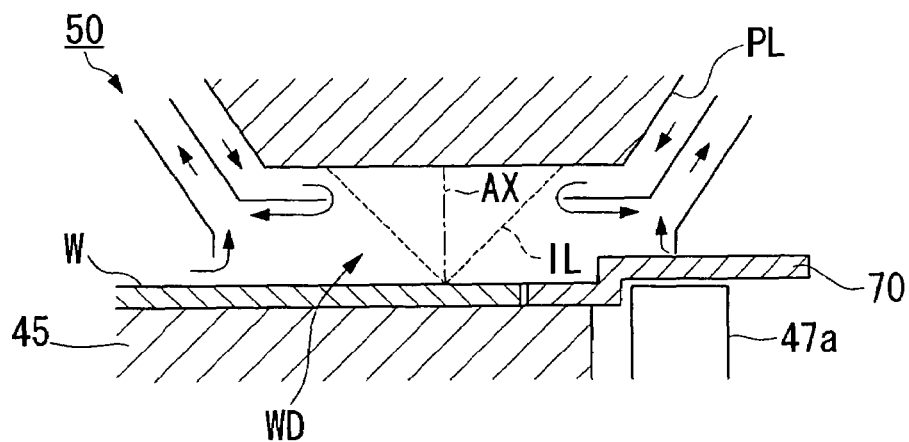
FIG. 5 is a view for showing the working distance section under condition that the periphery of the wafer on that side where a moving mirror for a laser interferometer is laid out is exposed.

FIG. 5 is a view showing working distance section WD at the time of exposing the vicinity of the edge portion of the wafer W on that side where the moving mirror 47*a* for the laser interferometer 47 is laid out. As shown in FIG. 5, the member 70 is placed in such a way as to cover the moving mirror 47*a*, which more surely prevents the permeable gas present in the working distance section WD from entering the optical path. In the embodiment, if the height of the member 70 is the same as the height of the wafer W, nonconformity, such as interference of the member 70 with the moving mirror 47*a*, so that the member 70 is provided with a slight step to prevent interference of the member 70 with the moving mirror 47*a*. That is, the height of that portion of the member 70 which extends outward of the wafer holder 45 is set higher than the moving mirror 47*a*. To adequately keep the gas state, it is preferable that the step should be minimized, e.g., 2 to 10 mm or so. Although the step is provided by bending the member 70 perpendicularly in the example in FIG. 5, the step may be provided by bending the member 70 obliquely or in an arc shape in order to suppress the staying of the gas or disturbance of the gas flow at the step portion.

In the exposure apparatus of the embodiment, as apparent from the above, the state where the light absorptive substance is removed from the side of the end portion of the projection optical system PL is maintained by placing the member 70 on the side of the end portion of the projection optical system PL at the time of moving the wafer W and causing the member 70 to be a part of the partition in the working distance section WD in place of the wafer W or complementarily. This prevents the leakage of the permeable gas to around the wafer W.

Figure 6:
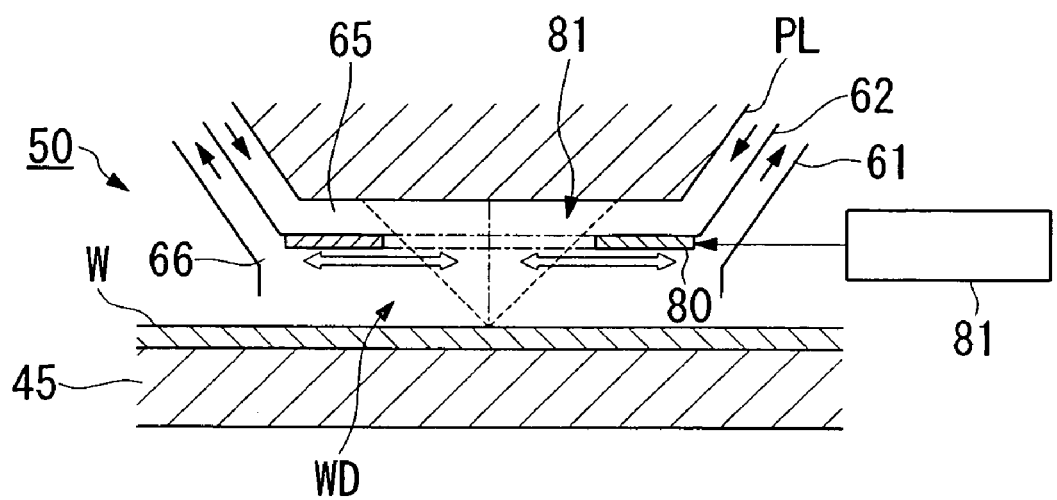
FIG. 6 is a side view for showing a second embodiment of the exposure apparatus according to the present invention and exemplarily showing a working distance section.

FIG. 6 illustrates the second embodiment of the exposure apparatus according to the invention, and the exposure apparatus of the embodiment has an opening/closing member 80, which opens and closes the gas supply port 65 in the gas supply/discharge system 50, and a driving unit 81, which moves the opening/closing member 80, as the object which is placed on the side of the end portion of the projection optical system PL in place of the wafer W at the time of moving the wafer W. Same symbols are given to those components of the embodiment which have the same functions as the components of the above-described embodiment to omit or simplify the descriptions.

In FIG. 6, the opening/closing member 80 is provided in such a way as to be able to open and close an opening 81 positioned on the side of the end portion of the projection optical system PL. In the gas supply/discharge system 50, when the opening/closing member 80 is open, the permeable gas supplied through the gas supply port 65 fills the space between the projection optical system PL and the wafer W, i.e., the working distance section WD, as explained in the previous embodiment. When the opening/closing member 80 is closed, on the other hand, closed space with the opening/closing member 80 being a part of the partition is formed on the side of the end portion of the projection optical system PL and the permeable gas fills inside the closed space. In the embodiment, the space between the gas supply pipe 62, the opening/closing member 80 and the projection optical system PL is always filled with the permeable gas.

The supply amount of the permeable gas to be supplied from the gas supply pipe 62 may be adjusted according to the opening/closing action of the opening/closing member 80. The amount of gas supply can be adjusted by controlling the degree of opening of a supply amount adjustment valve provided in the gas supply pipe 62.

The supply amount of the permeable gas is reduced when the closing action of the opening/closing member 80 starts, and the supply of the permeable gas is stopped when the closing action of the opening/closing member 80 is completed (when the opening/closing member 80 is closed completely). This can reduce the pressure load by the pressure of the permeable gas with respect to the optical member to be placed at the end portion of the projection optical system.

The supply amount of the permeable gas can be increased gradually according to the opening action of the opening/closing member 80.

Figure 7A:
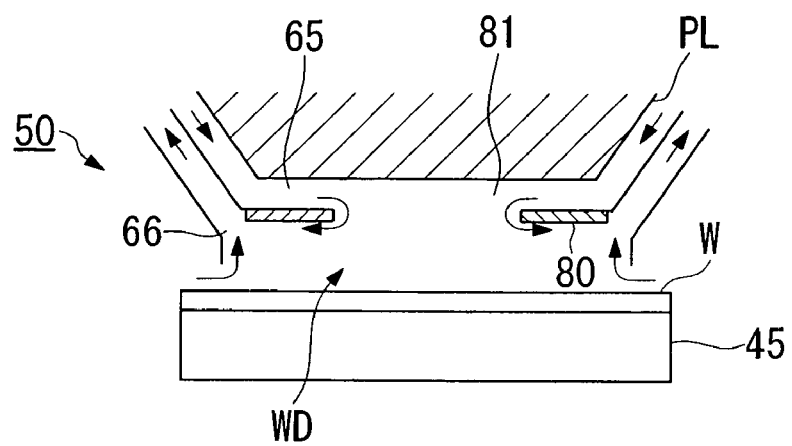
FIGS. 7A to 7C are views for showing the working distance section at the time of wafer replacement in the second embodiment.
Figure 7B:
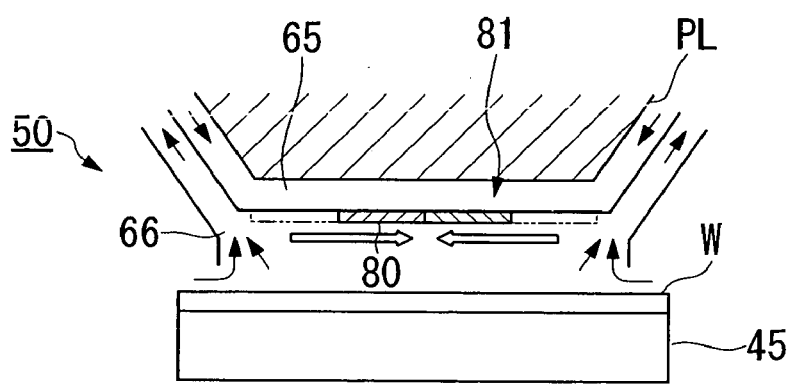
Figure 7C:
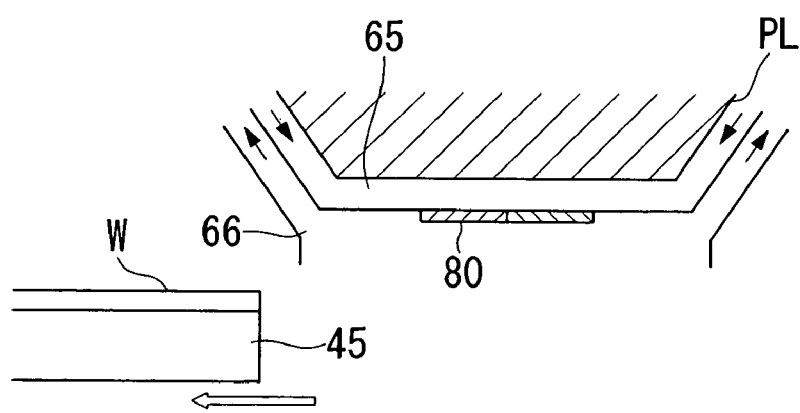

FIGS. 7A to 7C are views showing the working distance section WD at the time of replacing the wafer W in the exposure apparatus of the embodiment.

In FIG. 7A, at the time of exposure, the opening/closing member 80 is open and the working distance section WD is filled with the permeable gas. When exposure to one wafer W is finished, the opening/closing member 80 is moved to close the opening 81 in the gas supply/discharge system 50 as shown in FIG. 7B. Accordingly, the closed space formed on the side of the end portion of the projection optical system PL with the opening/closing member 80 being a part of the partition is filled with the permeable gas and the movement of the permeable gas toward the wafer W from the gas supply port 65 is inhibited. The permeable gas that remains on the wafer W is discharged from the exhaust port 66.

In FIG. 7C, when the permeable gas on the wafer W is entirely discharged, the wafer W on the side of the end portion of the projection optical system PL is replaced with a next wafer in the exposure apparatus. Because the permeable gas on the wafer W is discharged beforehand at the time of replacing the wafer W, the permeable gas does not influence the peripheral system, such as the laser interferometer, even if the wafer W is removed from the side of the end portion of the projection optical system PL. Whether the permeable gas on the wafer has been discharged entirely or not can be checked by providing an oxygen density meter in the discharge pipe 61 and monitoring the density of the permeable gas contained in the gas that is discharged from the exhaust port 66. It should be determined that all the permeable gas on the wafer W has been discharged as a predetermined time passes after the opening/closing member 80 is closed. When the next wafer W is placed at a predetermined position on the exit portion of the projection optical system PL, the opening/closing member 80 is opened again to fill the working distance section WD with the permeable gas again in the exposure apparatus as shown in FIG. 7A.

In the exposure apparatus of the embodiment, as apparent from the above, the state where the light absorptive substance is removed from the side of the end portion of the projection optical system PL can be maintained to prevent leakage of the permeable gas to the peripheral system by placing the opening/closing member 80 on the side of the end portion of the projection optical system PL to form closed space at the time of replacing the wafer W. In this case, the permeable gas is temporarily and completely removed from the place where a wafer is placed next at the time of replacing the wafer W, so that thereby surely preventing the wafer-replacement originated influence of the permeable gas on the peripheral system.

The combination of the first embodiment and the embodiment can maintain the gas state on the side of the end portion of the projection optical system PL and prevent leakage of the permeable gas both at the time of moving the wafer W and at the time of replacing the wafer W.

Figure 8A:
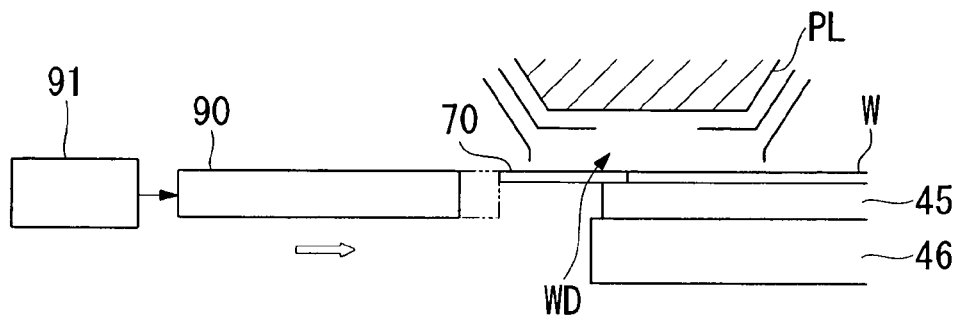
FIGS. 8A to 8C are side views for showing a third embodiment of the exposure apparatus according to the present invention.
Figure 8B:
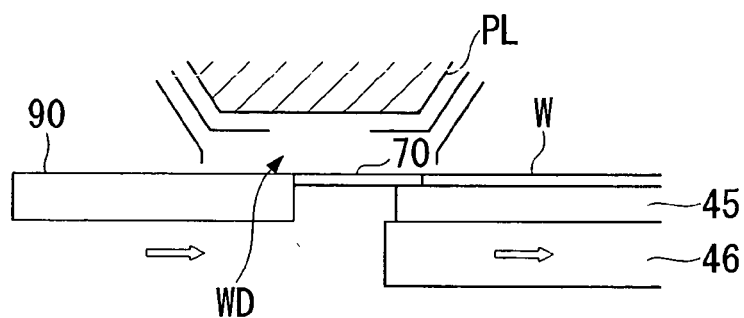
Figure 8C:
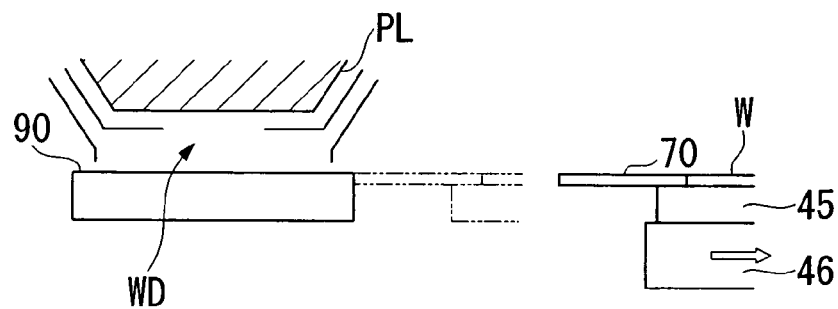

FIGS. 8A to 8C exemplarily illustrate the third embodiment of the exposure apparatus according to the invention, and the exposure apparatus of the embodiment has a movable spare stage 90 and a driving unit 91, which drives the spare stage 90, as the object which is placed on the side of the end portion of the projection optical system PL in place of the wafer W at the time of replacing the wafer W. The apparatus has the member 70 illustrated in the above-described first embodiment and secured onto the wafer holder 45. Same symbols are given to those components of this embodiment which have the same functions as the components of the above-described embodiment to omit or simplify the descriptions.

In FIG. 8A, at the time of exposing the end portion of the wafer W, the member 70 is placed on the side of the end portion of the projection optical system PL as per the first embodiment. The member 70 becomes a part of the partition in the working distance section WD in place of the wafer W or complementarily, thus keeping the gas state in the working distance section WD.

At the time of replacing the wafer W, the spare stage 90 is placed on the side of the end portion of the projection optical system PL in place of the wafer W. That is, when exposure with respect to one wafer W is finished, the spare stage 90 comes close to the wafer holder 45 (wafer stage 46) in the exposure apparatus of the embodiment. At this time, the spare stage 90 is placed in such a way that its surface forms a surface contiguous with the surface of the wafer W (including the top surface of the member 70). In other words, the end portion of the spare stage 90 and the member 70 are placed adjacent to each other at nearly the same heights.

In FIG. 8B, after the spare stage 90 comes close to the wafer stage 46, the wafer stage 46 and the spare stage 90 are moved horizontally (the direction crossing the optical axis) in the close state in the exposure apparatus to place the spare stage 90 on the side of the end portion of the projection optical system PL. Accordingly, the spare stage 90 is placed on the side of the end portion of the projection optical system PL, so that the spare stage 90 becomes a part of the partition in the working distance section WD or the second partition. As both stages 46 and 90 move in the close state, the partition is always formed on the side of the end portion of the projection optical system PL even during movement, thus keeping the gas state in the working distance section WD.

In FIG. 8C, when the spare stage 90 is placed directly below the projection optical system PL, the wafer stage 46 is moved to the wafer replacement position and the spare stage 90 stopped directly below the projection optical system PL, in the exposure apparatus. As a result, the wafer stage 46 is separated from the spare stage 90. Thereafter, a wafer on the wafer stage 46 (wafer holder 45) is replaced. When a next wafer is mounted on the wafer stage 46 (wafer holder 45), the wafer W is placed on the side of the end portion of the projection optical system PL in procedures opposite to the above-described sequence of procedures. That is, after the wafer stage 46 on which the next wafer is mounted is moved close to the spare stage 90, the spare stage 90 and the wafer stage 46 are moved in the close state to place the wafer stage 46 on the side of the end portion of the projection optical system PL.

In the exposure apparatus of the embodiment, as apparatus from the above, the state where the light absorptive substance is removed from the side of the end portion of the projection optical system PL is maintained to prevent leakage of the permeable gas to the periphery by placing the spare stage 90 on the side of the end portion of the projection optical system PL at the time of replacing the wafer W and causing the spare stage 90 to be a part of the partition in the working distance section WD, i.e., the second partition, in place of the wafer W or complementarily.

Although the gas state in the working distance section WD is kept by the member 70 fixed onto the wafer holder 45 at the time of exposing the edge portion of the wafer W in the embodiment, the member 70 may be omitted. In this case, for example, the spare stage 90 may be used to keep the gas state. That is, at the time of exposing the end portion of the wafer W, the spare stage 90 may be placed close to that end portion and the spare stage 90 may be used a part of the partition in place of the wafer W.

Figure 9A:
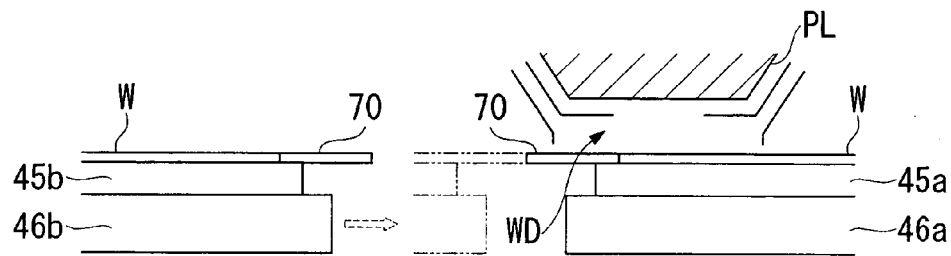
FIGS. 9A to 9C are side views for showing a fourth embodiment of the exposure apparatus according to the present invention.
Figure 9B:
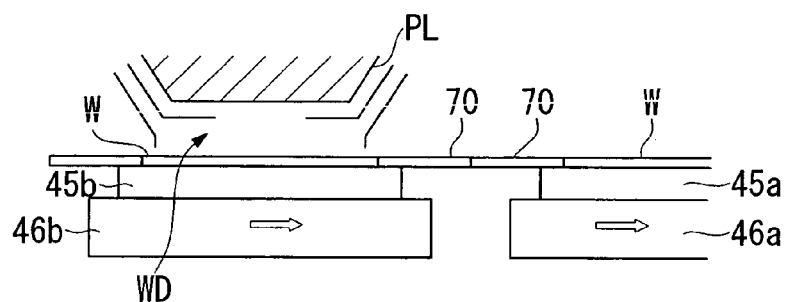
Figure 9C:
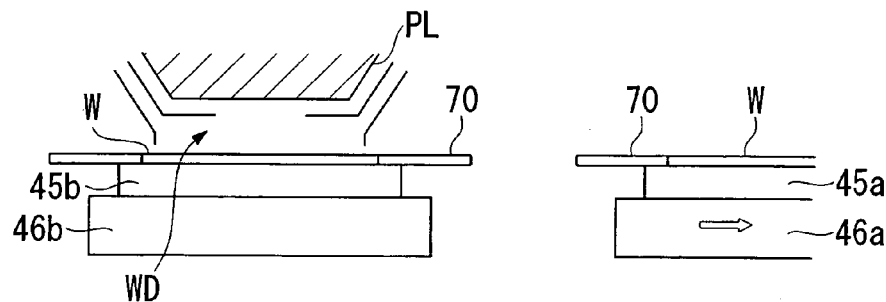

FIGS. 9A to 9C exemplarily illustrate the fourth embodiment of the exposure apparatus according to the invention, and the exposure apparatus of the embodiment has a plurality of movable wafer stages (a first wafer stage 46*a*, a second wafer stage 46*b*). The apparatus has the member 70 illustrated in the above-described first embodiment and secured onto a wafer holder 45*a*, 46*b*. Same symbols are given to those components of this embodiment which have the same functions as the components of the above-described embodiment to omit or simplify the descriptions.

In FIG. 9A, when exposure to the wafer W mounted on the first wafer stage 46*a* (wafer holder 45*a*) is finished, the second wafer stage 46*b* (wafer holder 45*b*) on which a next wafer W is mounted is moved close to the first wafer stage 46*a* in the exposure apparatus of the embodiment. At this time, the second wafer stage 46*b* is placed at the same height as the first wafer stage 46*a*. The approach makes the members 70 on the stages 46*a* and 46*b* adjacent to each other, forming a contiguous surface including the surface of the wafer W on the first wafer stage 46*a* (including the surface of the member 70) and the surface of the wafer W on the second wafer stage 46*b* (including the surface of the member 70).

In FIG. 9B, after the approach, both wafer stages 46*a*, 48*b* are moved horizontally (the direction crossing the optical axis) in the close state in the exposure apparatus to place the second wafer stage 46*b* on the side of the end portion of the projection optical system PL. Accordingly, the wafer W on the second wafer stage 46*b* becomes a part of the partition in the working distance section WD or the second partition. As both stages 46*a* and 46*b* move in the close state, the wafer W or the member 70 as the partition is always placed on the side of the end portion of the projection optical system PL even during movement, thus keeping the gas state in the working distance section WD.

In FIG. 9C, when the second wafer stage 46*b* is placed directly below the projection optical system PL, the first wafer stage 46*a* is moved with the second wafer stage 46*b* remaining as it is in the exposure apparatus. As a result, the first wafer stage 46*a* is separated from the second wafer stage 46*b*. Thereafter, exposure is performed on the wafer W on the second wafer stage 46*b* and the wafer on the first wafer stage 46*a* is replaced. After exposure of the wafer W on the second wafer stage 46*b* is finished, the first wafer stage 46*a* on which a next wafer is mounted is placed on the side of the end portion of the projection optical system PL in procedures opposite to the above-described sequence of procedures.

As apparent from the above, the exposure apparatus of the embodiment has a plurality of wafer stages and moves the plural wafer stages close to each other, thus always making the wafer W or the member 70 (part of the wafer holder) on the wafer stage 46*a*, 46*b* a part of the partition in the working distance section WD. This maintains the state where the light absorptive substance is removed from the side of the end portion of the projection optical system PL, thereby preventing leakage of the permeable gas to the periphery of the projection optical system PL.

Although the description of the embodiment has been given of the example that has two wafer stages, the number of wafer stages is not limited to two. When it is difficult to move the wafer stages close to each other due to physical or control restrictions, another object may be placed between plural wafer stages. This example will be described next.

Figure 10A:
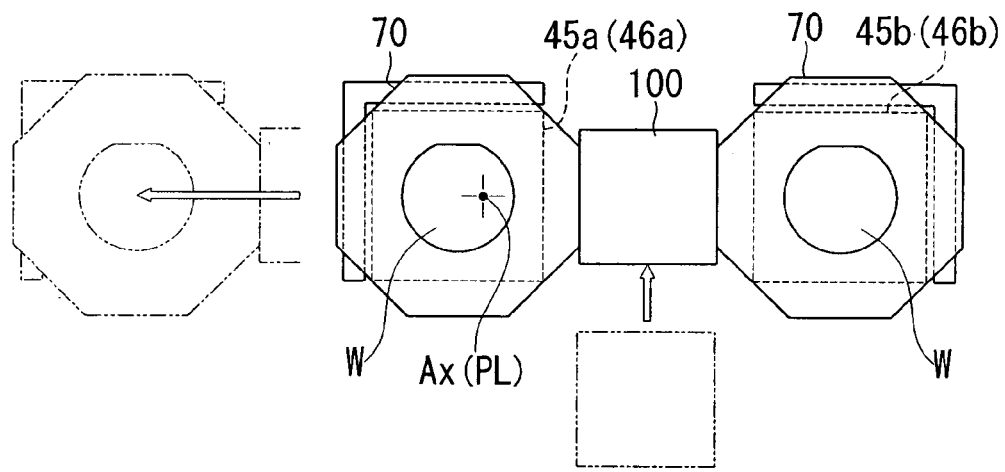
FIGS. 10A and 10B are plan views for showing a fifth embodiment of the exposure apparatus according to the present invention.
Figure 10B:
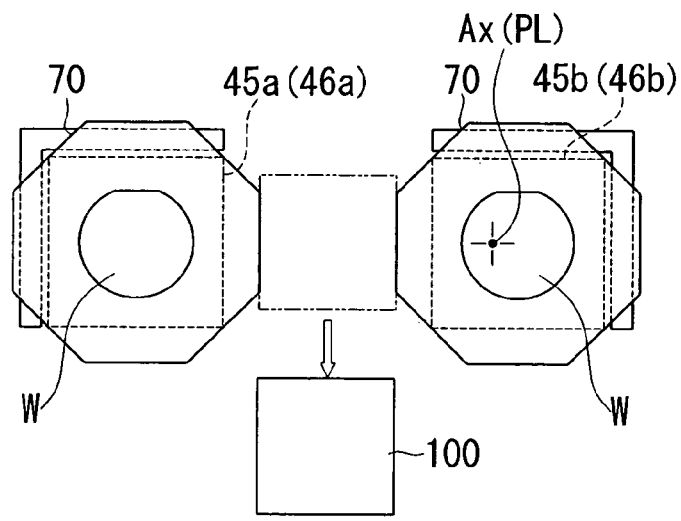

FIGS. 10A and 10B exemplarily illustrate the fifth embodiment of the exposure apparatus according to the invention, and the exposure apparatus of the embodiment has a plurality of movable wafer stages (first wafer stage 46*a*, second wafer stage 46*b*) and a spare stage 100 arranged in an insertable and removable manner between the plural wafer stages 46*a* and 46*b*. The member 70 illustrated in the above-described first embodiment is secured onto each wafer holders 45*a*, 45*b*. Same symbols are given to those components of this embodiment which have the same functions as the components of the above-described embodiment to omit or simplify the descriptions.

In FIG. 10A, when exposure to the wafer W mounted on the first wafer stage 46*a* (wafer holder 45*a*) is finished, the spare stage 100 is placed between the first wafer stage 46*a* and the second wafer stage 46*b*. At this time, the spare stage 100 is moved close to the first wafer stage 46*a* and the second wafer stage 46*b* is moved close to the spare stage 100. This forms a contiguous surface including the surface of the wafer W on the first wafer stage 46*a* (including the surface of the member 70), the surface of the spare stage 100 and the surface of the wafer W on the second wafer stage 46*b* (including the surface of the member 70).

After the approach of the three stages 46*a*, 46*b* and 100, the wafer stages 46*a*, 46*b* and 100 are moved horizontally (the direction crossing the optical axis AX of the projection optical system PL) in the close state in the exposure apparatus to place the second wafer stage 46*b* on the side of the end portion of the projection optical system PL. Accordingly, the wafer W on the second wafer stage 46*b* becomes a part of the partition in the working distance section WD or the second partition. As the stages 46*a*, 46*b* and 100 move in the close state, the wafer W, the member 70 or the spare stage 100 as the partition is always placed on the exit portion of the projection optical system PL even during movement, thus keeping the gas state in the working distance section WD.

In FIG. 10B, after the second wafer stage 46b is placed directly under the projection optical system PL, the spare stage 100 is moved out from between the first and second wafer stages 46a and 46b with the second wafer stage 46b remaining as it is in the exposure apparatus. Thereafter, exposure is performed on the wafer W on the second wafer stage 46b and the wafer on the first wafer stage 46a is replaced with a next wafer.

As apparent from the above, the exposure apparatus of the embodiment has a plurality of wafer stages 46a, 46b and the spare stage 100 located so as to be inserted and removed between the plural wafer stages 46a and 46b, and moves the plural wafer stages 46a and 46b close to each other with the spare stage 100 in between, so that the wafer W and the member 70 (part of the wafer holder) on the wafer stage 46a, 46b or the surface of the spare stage 100 become a part of the partition or the second partition in the working distance section WD. It is therefore possible to maintain the state where the light absorptive substance is removed from the exit portion of the projection optical system PL and prevent leakage of the permeable gas to the periphery.

Although the three stages including the spare stage are moved in a close state in the embodiment, the invention is not limited to this case. For example, only two stages, one of the plural stages and the spare stage, may be moved in a close state. That is, first, after exposure at the first wafer stage is finished, the spare stage is moved close to the first wafer stage and the two stages are moved in that close state to place the spare stage on the exit portion of the projection optical system. Thereafter, with the spare stage left as it is, the first wafer stage alone is moved to be separated from the spare stage. Next, the second wafer stage is moved close to the spare stage placed on the side of the end portion of the projection optical system. In the close state, the two stages are moved to place second wafer stage on the side of the end portion of the projection optical system. In this case, it is unnecessary to move the first wafer stage and the second wafer stage close to each other, making it difficult to cause the interference of the wafer stages with each other.

Figure 11:
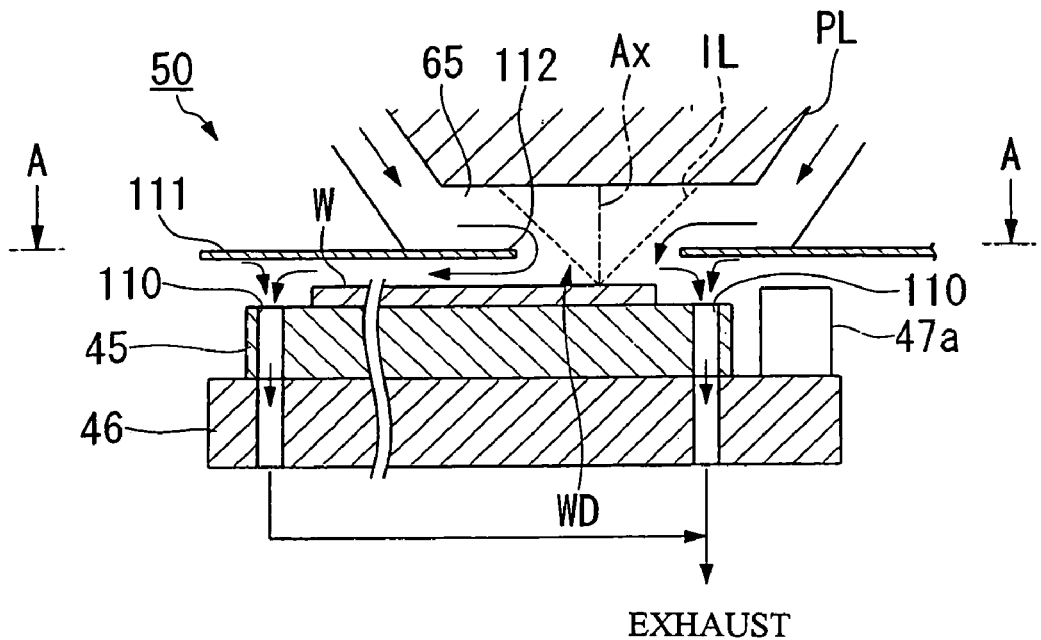
FIG. 11 is a side view for showing a sixth embodiment of the exposure apparatus according to the present invention.
Figure 12:
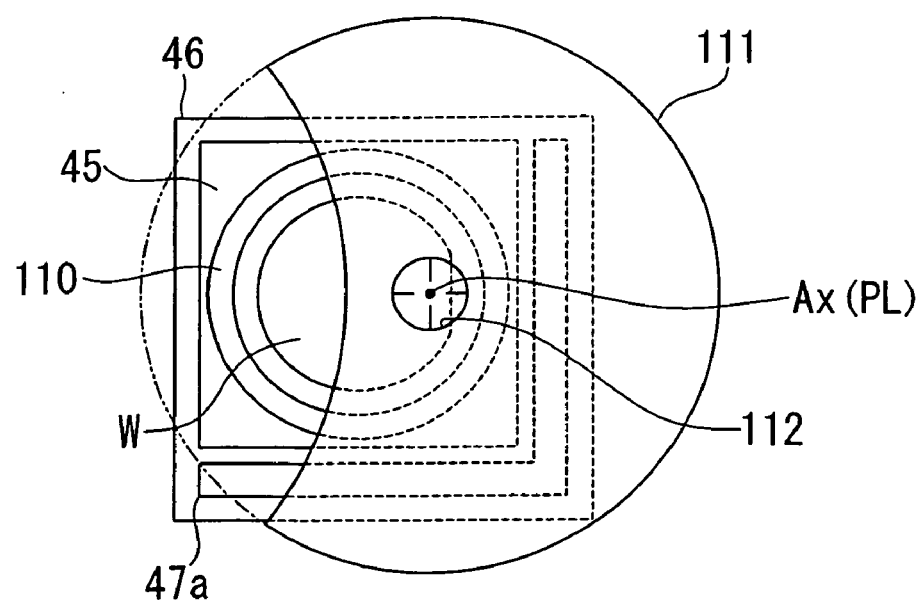
FIG. 12 is a view as which is viewed in a direction which is indicated by an arrow A—A shown in FIG. 11.

FIGS. 11 and 12 exemplarily illustrate the sixth embodiment of the exposure apparatus according to the invention, and the exposure apparatus of the embodiment has an exhaust port 110 which discharges a gas including a permeable gas from around a wafer W. Same symbols are given to those components of this embodiment which have the same functions as the components of the above-described embodiment to omit or simplify the descriptions.

The exhaust port 110 is annularly provided around the mount position of the wafer W and closer to the wafer W side than the moving mirror 47a of the laser interferometer. In the embodiment, the exhaust port 110 moves together with the wafer W, is provided in the wafer holder 45, and is connected to an unillustrated vacuum pump via the wafer stage 46. The embodiment is not provided with a fixed type exhaust port (the exhaust port 66 shown in FIG. 2) which is located on the projection optical system PL side as illustrated in the first embodiment.

The exposure apparatus of the embodiment has a plate-like member 111 which separates the side of the end portion of the projection optical system PL from the wafer stage 46. In the embodiment, the member 111 becomes a part of the member that forms the gas supply port 65 in the gas supply/discharge system 50, and is provided approximately in parallel to the wafer W on the side of the end portion of the projection optical system PL, and an opening 112 for passing the exposure light IL is provided near its center. The size of the member 111 is determined in such a way that the exhaust port 110 provided around the wafer W is always covered with the member 111, and is set to about two times the outside diameter of the wafer W, for example.

In the exposure apparatus of the embodiment, at the time of exposing the wafer W, the permeable gas is supplied toward the wafer W from the gas supply port 65 in the gas supply/discharge system 50 as in each embodiment described above. The permeable gas is supplied to the working distance section WD via the opening 112 of the member 111 and is discharged via the exhaust port 110. At this time, the discharge amount from the exhaust port 110 is so set as to become larger than the supply amount of the permeable gas. Through the gas supply and discharge, the light absorptive substance present in the working distance section WD or the gas which tends to newly enter the working distance section WD is discharged together with the permeable gas through the exhaust port 110 around the wafer W, and the working distance section WD is filled with the permeable gas with the exit side of the projection optical system PL, the member 111 and the wafer W or the like being a part of the partition.

As the discharge stage is always maintained at the time of exposure. This prevents leakage of the permeable gas to the periphery of the wafer stage 46. As the fixed type member 111 becomes the partition in the working distance section WD, gas diffusion is prevented and the flow of the permeable gas toward around the wafer W from near the optical axis AX is formed, causing the permeable gas to be surely discharged through the exhaust port 110.

As apparent from the above, the exposure apparatus of the embodiment discharges a gas including the permeable gas from around the wafer W via the exhaust port 110 that moves together with the wafer W, so that the state where the light absorptive substance is removed from the side of the end portion of the projection optical system PL is maintained to prevent leakage of the permeable gas to the periphery of the wafer W even at the time of moving the wafer W.

The shape of the exhaust port is not limited to the one in the embodiment but any shape which discharges a gas from around a wafer can be taken.

Figure 13A:
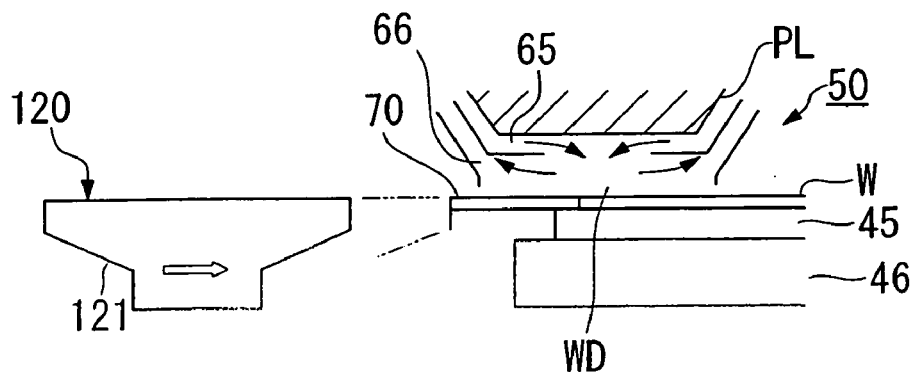
FIGS. 13A to 13C are side views for showing a seventh embodiment of the exposure apparatus according to the present invention.
Figure 13B:
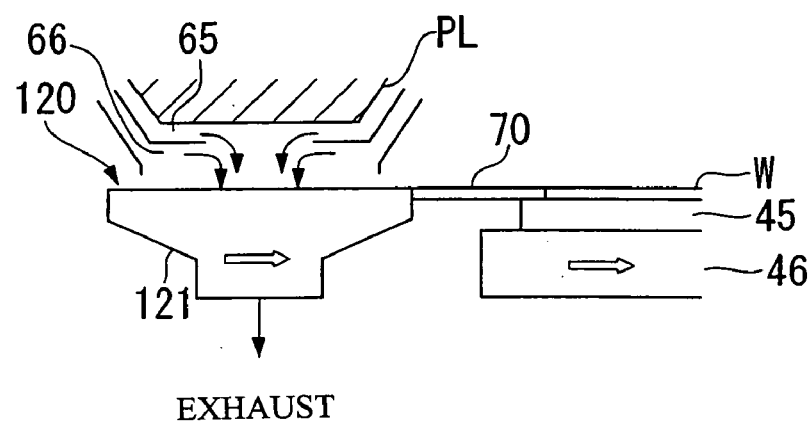
Figure 13C:
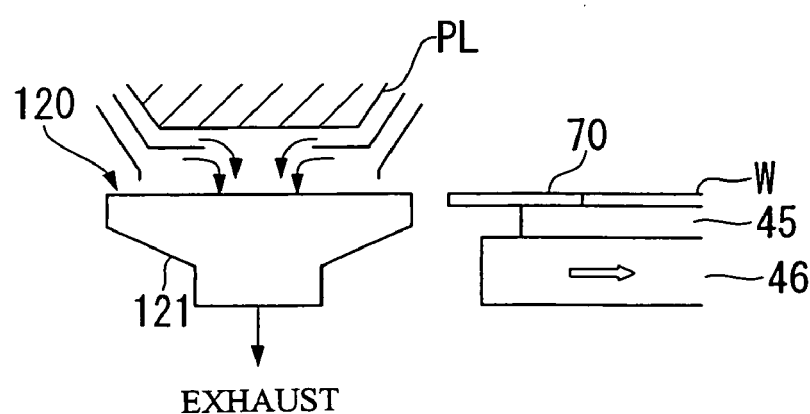

FIGS. 13A to 13C exemplarily illustrate the seventh embodiment of the exposure apparatus according to the invention, and the exposure apparatus of the embodiment has a discharge duct 121 having an exhaust port 120 located so as to be inserted and removed on the side of the end portion of the projection optical system. The apparatus has the member 70 illustrated in the above-described first embodiment and secured onto the wafer holder 45. Same symbols are given to those components of this embodiment which have the same functions as the components of the above-described embodiment to omit or simplify the description.

In FIG. 13A, at the time of exposing the wafer W, the working distance section WD is filled with a permeable gas in the exposure apparatus of the embodiment as per the first embodiment. At the time of exposing the edge portion of the wafer W, the member 70, which is placed on the side of the end portion of the projection optical system PL, becomes a part of the partition in the working distance section WD in place of the wafer W or complementarily, thus keeping the gas state in the working distance section WD. When exposure to one wafer W is finished, the discharge duct 121 is moved close to the wafer holder 45 (wafer stage 46). At this time, the exhaust port 120 is placed adjacent to the member 70 at approximately the same height.

In FIG. 13B, after the discharge duct 121 comes close to the wafer stage 46, the wafer stage 46 and the discharge duct 121 are moved horizontally (the direction crossing the optical axis) in the close state in the exposure apparatus to place the exhaust port 120 on the side of the end portion of the projection optical system PL. The gas on the side of the end portion of the projection optical system PL is discharged through the exhaust port 120. At this time, the discharge amount from the exhaust port 120 is so set as to become larger than the supply amount of the permeable gas. This prevents leakage of the permeable gas to the periphery of the projection optical system PL. The discharge by the discharge duct 121 is carried out even during movement of the wafer stage 46. As the discharge duct 121 and the wafer stage 46 move in the close state, the permeable gas is surely discharged through the exhaust port 120 without leakage to the vicinity.

In FIG. 13C, when the exhaust port 120 is placed directly under the projection optical system PL, the wafer stage 46 is moved with the discharge duct 121 left as it is. As a result, the wafer stage 46 is separated from the discharge duct 121. Thereafter, the wafer W on the wafer stage 46 (wafer holder 45) is replaced. When a next wafer is mounted on the wafer stage 46 (wafer holder 45), the wafer W is placed on the side of the end portion of the projection optical system PL in procedures opposite to the above-described sequence of procedures. That is, after the wafer stage 46 on which the next wafer is mounted is moved close to the discharge duct 121, the discharge duct 121 and the wafer stage 46 are moved in that close state to place the wafer stage 46 on the side of the end portion of the projection optical system PL.

In the exposure apparatus of the embodiment, as apparent from the above, leakage of the permeable gas to the periphery of the wafer W is prevented by placing the discharge duct 121 on the side of the end portion of the projection optical system PL and discharging a gas including the permeable gas from the side of the end portion of the projection optical system PL.

In the embodiment, discharging from the exhaust port 66 of the gas supply/discharge system 50 may be stopped while the exhaust port 120 of the discharge duct 121 is placed on the side of the end portion of the projection optical system PL. This forms the adequate flow of the gas toward the exhaust port 120 of the discharge duct 121 and surely discharges the permeable gas through the exhaust port 120. Alternatively, the permeable gas may be supplied from the exhaust port 66 of the gas supply/discharge system 50 during the placement. The supply of the permeable gas from the exhaust port 66 causes the exit portion of the projection optical system PL to be filled with the permeable gas during discharging through the exhaust port 120, thus preventing adhesion of a light absorptive substance to the end portion or so of the projection optical system PL.

The shapes of the exhaust port and the discharge duct are not limited to those of the above-described embodiment, but may take any shapes as long as the permeable gas can be discharged when a wafer is removed from the side of the end portion of the projection optical system. Because the discharge duct can be inserted and removed on the side of the end portion of the projection optical system, the embodiment has an advantage that the discharge duct can be placed at the desired position while avoiding interference with the wafer stage. However, the discharge duct may be fixed at a position where it does not interfere with the wafer stage.

Further, another modification, though not illustrated, which suppresses leakage of the permeable gas from the side of the end portion of the projection optical system PL at the time of wafer replacement or at the time of wafer movement, will be described.

In the modification, the permeable gas that has filled the working distance section WD through the gas supply port 65 may be sucked at the time of wafer replacement or at the time of wafer movement. That is, a discharge pump should be provided in the gas supply pipe 62 and should be activated at the time of wafer replacement or at the time of wafer movement. When the gas supply port 65 is operated as a gas exhaust port, discharge at the exhaust port 66 may be continued, but the discharge operation of the exhaust port 66 may be stopped. When the working distance section WD is returned to the atmospheric state quickly, it is desirable to stop the discharge operation of the exhaust port 66. Further, it is desirable to dispose an oxygen density meter or a gas component analyzer or the like in the gas supply pipe 62 in order to check whether the working distance section WD is returned to the atmospheric state or not.

When the wafer W is positioned again directly under the projection optical system PL, the wafer W serves again as the second partition. At this time, the working distance section WD is still in the atmospheric state, so that it is desirable that a greater amount of permeable gas than the supply amount of the gas to be supplied during the exposure operation should be supplied from the gas supply port 65 to carry out fast gas replacement.

When the discharge operation of the exhaust port 66 is stopped at the time of wafer replacement or at the time of wafer movement, it is desirable to start the gas discharge operation at the same time as the permeable gas is supplied from the gas supply port 65 or before the gas supply.

At the time of wafer replacement or at the time of wafer movement, the working distance section WD an be set to the atmospheric state quickly by supplying the atmospheric air or chemically purified air from the gas supply port 65 and further continuing the discharge operation of the exhaust port 66.

Although the structure that uses the member 70 having a surface extending outward from the vicinity of the periphery of the wafer W has been described in the description of the individual embodiments, the structure is not restrictive. For example, instead of providing the member 70, the wafer stage 46 and the member 70 may be constructed integrally. For example, the wafer stage 46 itself may be enlarged so that a part of the wafer stage 46 is positioned directly under the projection optical system PL even at the time of wafer replacement or at the time of wafer movement.

Although preferable embodiments according to the invention have been explained above referring to the accompanying drawings, the invention is not limited to the embodiments. It should be apparent to those skilled in the art to anticipate various modifications or alterations within the scope of the technical concept set forth in the appended claims, and those should naturally belong to the technical scope of the invention.

For example, the local purge mechanism that has been explained in each embodiment described above has the structure where the gas supply port 65 of the gas supply pipe 62 is laid out in such a way as to surround the optical axis AX of the projection optical system PL and the exhaust port 66 of the discharge pipe 61 is provided outside it. However, the structure for keeping the space of the working distance section WD to the light-absorptive-substance removed state is not limited to this structure.

Figure 14:
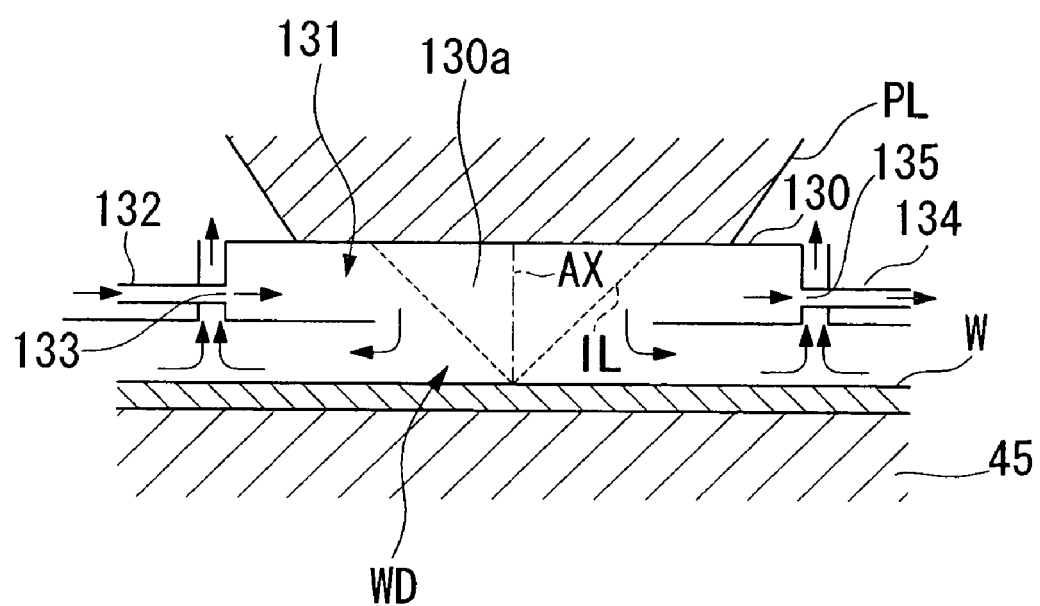
FIG. 14 is a view for showing a modified example for a local purge mechanism.

For example, the structure shown in FIG. 14 is available. In the structure, a first partition 130 which forms space where the permeable gas is to be supplied is provided under an optical element disposed on the end portion of the projection optical system PL where the exposure light IL is emitted, i.e., at the bottommost stage of the projection optical system PL (a boundary optical element which is placed at the boundary between the internal space and the external space of the projection optical system PL: the boundary optical element is provided in the projection optical systems PL according to the first embodiment to the sixth embodiment). The first partition 130 is comprised of a plate-like member or so formed into an approximately box shape and forms space (first space 131) which covers the top surface of the boundary optical element. The first partition 130 is directly fixed to the projection optical system PL, or fixed via a bellows (a metal bellows, a film-shaped bellows, a bellows formed of an elastic material or so) not to transmit vibration to the projection optical system PL, or fixed to another stationary object, such as a frame, which supports the projection optical system PL. A gas supply pipe 132 is connected to the first partition 130, so that the permeable gas is supplied to the first space 131 via a gas supply port 133. A discharge pipe 134 is connected to the first partition 130, so that a gas including the permeable gas is discharged from the first space 131 via an exhaust port 135. The supply amount of the permeable gas from the gas supply port 133 and the discharge amount from the exhaust port 135 are adjusted in such a way that the pressure in the first space 131 becomes higher than the atmospheric pressure (e.g., higher than the atmospheric pressure in a range from 0.001 to 10%).

As an opening 130a for exposure light is formed in the first partition 130 and the first space 131 is adjusted to a pressure higher than the atmospheric pressure, the space of the working distance section WD can be kept in the light-absorptive-substance removed state by letting a part of the gas inside the first space 131 flow toward the wafer W via the opening 130a. Even this structure can employ a mechanism or a structure for preventing leakage of the permeable gas to the periphery of the wafer W at the time of moving the wafer W or at the time or replacing the wafer W as has been described in the embodiment.

Further, the supply amount of the permeable gas from the gas supply port and the discharge amount of the gas from the exhaust port may be changed between the time when near the center of the substrate is exposed and the time when near the edge portion of the substrate is exposed. The same is applied to the time of replacing the substrate.

A density control may be executed by providing a density meter which measures the density of the light absorptive substance in the working distance section and adjusting the supply amount and the discharge amount of the permeable gas based on the measurement.

Although the description of each embodiment discussed above has been given of the gas supply port and the exhaust port, a straightening vane, a guide or the like should be adequately provided in order to set the flow of the permeable gas to the desired state.

The degassified gas including a light absorptive substance from a photosensitive agent (photoresist) coated on a wafer differs in quantity and type according to the type of the photosensitive agent and the temperature or the like. In this case, the amount and the type of degassification from the photosensitive agent should be examined beforehand and the supply amount of the permeable gas should be adjusted by the photosensitive agent. This can minimize the consumption amount of the permeable gas which is generally expensive while surely removing the light absorptive substance from the working distance section.

To remove the light absorptive substance from the optical path, it is preferable to perform a treatment of reducing the amount of degassification from the top surface of the structure material beforehand. For example, there are methods: (1) the surface are of the structure material is made smaller, (2) the top surface of the structure material is polished by a scheme, such as mechanical polishing, electrolytic polishing, bar polishing, chemical polishing or GBB (Glass Beads Blasting) to reduce the surface roughness of the structural material, (3) the top surface of the structural material is cleaned with a scheme, such as ultrasonic cleaning, blasting of a fluid like clean dry air, or vacuum are degassification (baking), and (4) a cable coating material, a seal member (O ring or the like), an adhesive or so containing hydrocarbon or a halide is not provided as much as possible.

It is desirable that the casing (cylindrical casing possible) which constitutes the cover of the wafer manipulation section from the illumination chamber and the pipe which supplies the permeable gas should be formed of materials less containing the permeable gas (degassified gas), e.g., stainless steel, titanium alloy, ceramics, or various kinds of polymers, such as tetrafluoroethylene, tetrafluoroethylene-terfluoro(alkylvinyl ether) or tetrafluoropropene copolymer.

It is also desirable that a cable or so which supplies power to the drive mechanism (reticle blind, stage, etc) in each casing should be likewise coated with a material less containing the permeable gas (degassified gas).

It is apparent that the invention is adapted to a spontaneous exposure type (stepper type) projection exposure apparatus or so as well as a scan exposure type projection exposure apparatus. The projection optical systems that are provided in those apparatuses are not limited to catadioptric system but may be a refraction system or a reflection system. Further, the magnification of the projection optical system may be the equal magnification or enlarging magnification as well as the reducing magnification.

The invention can be adapted to a case of using an ArF excimer laser beam (wavelength of 193 nm), a $Kr_2$ laser beam (wavelength of 146 nm), an $Ar_2$ laser beam (wavelength of 126 nm), or vacuum ultraviolet rays with a wavelength of about 200 nm to 100 nm, such as a high harmonic of a YAG laser or the like or a high harmonic or so of a semiconductor laser, as the energy beam.

Instead of using an excimer laser or an $F_2$ laser or so, a harmonic may be used which is acquired by amplifying an infrared band generated from a (Distributed feedback) semiconductor laser or a fiber laser, or a single-mode laser of a visible band may be amplified by a fiber amplifier doped with, for example, erbium (Er) (or both erbium and ytterbium (Yb)) and performing wavelength conversion to ultraviolet rays using a non-linear optical crystal.

The use of the exposure apparatus is not limited to an exposure apparatus for semiconductor fabrication, and can be widely adapted to, for example, an exposure apparatus for liquid crystal which exposes a liquid crystal display element pattern onto a rectangular glass plate and an exposure apparatus for manufacturing thin film magnetic heads.

When a linear motor is used for the wafer stage and the reticle stage, either an air floating type which uses an air bearing or a magnetic floating type which uses Lorentz's force or reactive force may be used. The stage may be of a type which moves along a guide or may be of a guide-less type which is not provided with a guide.

When a planar motor is used as the driving unit for the stage, either one of a magnet unit (permanent magnet) and an armature unit should be connected to the stage and the other one of the magnet unit and the armature unit should be provided on the movable side (base) of the stage.

The reaction force generated by the movement of the wafer stage may be made to escape to the floor (ground)

mechanically by using a frame member as described in Japanese Patent Laid-Open Publication No. H8-116475. The invention can also be adapted to an exposure apparatus having such a structure.

The reaction force generated by the movement of the reticle stage may be made to escape to the floor (ground) mechanically by using a frame member as described in Japanese Patent Laid-Open Publication No. H8-330224. The invention can also be adapted to an exposure apparatus having such a structure.

As described above, the exposure apparatuss according to the embodiments of the invention are manufacture by assembling various kind of sub systems including individual components as recited in the appended claims in such a way as to keep predetermined mechanical precision, electrical precision and optical precision. To guarantee those various precisions, adjustment to achieve the optical precisions in various kinds of optical systems, adjustment to achieve the mechanical precisions in various kinds of mechanical systems, and adjustment to achieve the electrical precisions in various kinds of electrical systems are executed before and after assembling. A step of assembling various kind of sub systems into the exposure apparatus includes mechanical connection of the various kind of sub systems, interconnection of electric circuits thereof and pipe connection or so of pressure circuits. It is needless to say that there are steps of assembling the individual sub systems before the step of assembling various kind of sub systems into the exposure apparatus. When the step of assembling various kind of sub systems into the exposure apparatus is finished, global adjustment is performed to ensure various kinds of precisions of the exposure apparatus as a whole. It is desirable that the manufacture of the exposure apparatus should be carried out in a clean room where the temperature and the degree of cleanness or so are controlled.

As a wafer W which has undergone exposure in the above-described manner goes through the developing step, the pattern forming step, the bonding step, packaging and so forth, an electronic device, such as a semiconductor device, is manufactured.

INDUSTRIAL APPLICABILITY

The exposure method and exposure apparatus according to the invention can suppress leakage of the permeable gas from the exit portion of the projection optical system even at the time of moving a substrate or at the time of replacing the wafer, and thus can keep the light-absorptive-substance removed gas state on the exit portion of the projection optical system.

According to the device manufacturing method of the invention, reduction in control precision caused by leakage of the permeable gas is prevented in the exposure apparatus, so that the pattern precision can be improved.

The invention claimed is:

1. An exposure method for forming a pattern onto a substrate via a projection optical system using an energy beam, the method comprising the steps of:
    placing a substrate stage under the projection optical system;
    moving an object so that the object is close to the substrate stage; and
    placing the object under the projection optical system in place of the substrate stage by moving the object together with the substrate stage under a condition such that the object is disposed close to the substrate stage.

2. An exposure method according to claim 1, wherein the object is a plate member that is disposed such that a distance from the projection optical system is approximately similar to a distance from the substrate.

3. An exposure method according to claim 1, wherein the object is a stage among a plurality of stages that support the substrate.

4. An exposure method according to claim 1, wherein the object is a spare stage.

5. An exposure method according to claim 4, wherein a height of a surface of the spare stage is set to be the same as a height of a surface of the substrate stage when the substrate is exchanged.

6. An exposure method according to claim 5, wherein the substrate stage moves to a position in which the substrate is exchanged after the spare stage is disposed under the projection optical system.

7. An exposure method according to claim 6, wherein the substrate stage that supports a next substrate moves together in a same direction with the spare stage after the substrate stage moves close to the spare stage, and the spare stage moves from under the projection optical system.

8. An exposure apparatus for forming a pattern onto a substrate via a projection optical system using an energy beam, the exposure apparatus comprising:
    a substrate stage disposed under the projection optical system;
    a first driver connected to the substrate stage and that drives the substrate stage;
    an object that can be disposed under the projection optical system in place of the substrate stage;
    a second driver connected to the object and that drives the object; and
    a controller connected to the first and second drivers and that causes the object to move together with the substrate stage under a condition such that the object is disposed close to the substrate stage so that the object is placed under the projection optical system.

9. An exposure apparatus according to claim 8, wherein the object is disposed such that a distance between the object and the projection optical system is approximately the same as a distance between the substrate and the projection optical system.

10. An exposure apparatus according to claim 8, wherein the substrate stage has an end portion that is adjacent to the object when the substrate is exchanged.

11. An exposure apparatus according to claim 10, wherein:
    the object has a platelike member having an aperture that has a shape approximately the same as a shape of the substrate; and
    a surface of the substrate stage forms a surface that is continuous from the surface of the substrate.

12. An exposure apparatus according to claim 8, wherein the object is a spare stage that is distinct from the substrate stage.

13. An exposure apparatus according to claim 12, wherein the controller sets a surface of the spare stage and a surface of the substrate stage at a same height when the substrate is exchanged.

14. An exposure apparatus according to claim 13, wherein the substrate stage moves to a position where the substrate is exchanged after the spare stage is disposed under the projection optical system.

15. An exposure apparatus according to claim 14, wherein:

the controller moves the substrate stage that supports a next substrate close to the spare stage;

after that, the controller moves the spare stage together in a same direction with the substrate stage; and the controller moves the spare stage to a distant region from under the projection optical system.

16. An exposure apparatus according to claim 12, wherein the spare stage is provided with a plate member that is disposed such that:

a distance between a surface of the spare stage and the projection optical system is approximately the same as a distance between a surface of the substrate and the projection optical system.

17. An exposure apparatus according to claim 8, further comprising a plurality of stages that support the substrate, wherein the object is a stage among the plurality of stages.

18. An exposure apparatus for forming a pattern onto a substrate via a projection optical system, the exposure apparatus comprising:

a first substrate stage that is placed under the projection optical system so as to expose a first substrate on the first substrate stage with an energy beam; and a second substrate stage that is placed under the projection optical system in place of the first substrate stage by moving the second substrate stage together with the first substrate stage under a condition such that the second substrate stage is disposed close to the first substrate stage, so as to expose the second substrate on the second substrate stage with the energy beam, after completing the exposure of the first substrate.

19. A exposure apparatus according to claim 18, wherein the first substrate stage is disposed such that a height of the first substrate is the same as a height of the second substrate when the second substrate stage moves close to the first substrate stage.

20. An exposure apparatus according to claim 18, wherein:

the first substrate stage has a plate member with a surface height that is the same as a surface height of the first substrate; and the second substrate stage has a plate member with a surface height that is the same as a surface height of the second substrate.

21. An exposure apparatus for forming a pattern onto a substrate via a projection optical system, the exposure apparatus comprising:

a first substrate stage that is placed under the projection optical system so as to expose a first substrate on the first substrate stage with an energy beam;

a second substrate stage that is placed under the projection optical system in place of the first substrate stage so as to expose a second substrate on the second substrate stage with the energy beam; and a spare stage that is disposed between the first substrate stage and the second substrate stage, wherein:

the second substrate stage is placed under the projection optical system in place of the first substrate stage by moving the second substrate stage together with the first substrate stage and the spare stage under a condition such that the second substrate stage and the spare stage are disposed close to the first substrate stage, after completing the exposure of the first substrate.

22. An exposure apparatus according to claim 21, wherein a surface of the first substrate, a surface of the second substrate, and a surface of the spare stage form a continuous surface under a condition that the first substrate stage, the second substrate stage, and the spare stage are disposed close to one another.

23. An exposure apparatus according to claim 22, wherein:

the first substrate stage has a plate member with a surface height that is the same as a surface height of the first substrate; and the second substrate stage has a plate member with a surface height that is the same as a surface height of the second substrate.

24. An exposure apparatus according to claim 21, wherein the first substrate stage and the spare stage move distantly from the second substrate stage after disposing the second substrate stage under the projection optical system.

25. An exposure method for forming a pattern onto a substrate via a projection optical system using an energy beam, the method comprising the steps of:

placing a first substrate stage under the projection optical system so as to expose a first substrate on the first substrate stage with the energy beam;

moving a second substrate stage so that the second substrate stage is close to the first substrate stage, so as to expose a second substrate on the second substrate stage with the energy beam after completing the exposure of the first substrate;

moving the second substrate stage together with the first substrate stage under a condition such that the second substrate stage is disposed close to the first substrate stage; and placing the second substrate stage under the projection optical system in place of the first substrate stage.

26. An exposure method for forming a pattern onto a substrate via a projection optical system using an energy beam, the method comprising the steps of:

placing a first substrate stage under the projection optical system so as to expose a first substrate on the first substrate stage with the energy beam;

providing a second substrate stage that holds a second substrate so as to expose the second substrate with the energy beam;

disposing a spare stage between the first substrate stage and the second substrate stage after completing the exposure of the first substrate;

moving the spare stage close to the first substrate stage and moving the second substrate stage close to the spare stage;

moving the second substrate stage together with the first substrate stage and the spare stage under a condition such that the second substrate stage is disposed close to the first substrate stage and the spare stage; and placing the second substrate stage under the projection optical system in place of the first substrate stage.

27. An exposure method for transferring a pattern of a mask onto a substrate via a projection optical system using an energy beam, wherein a light absorbing substance that absorbs the energy beam is removed from a periphery of the substrate via a piping mouth that moves together with the substrate so as to maintain a condition under which the energy beam can be transmitted through a space between the substrate and an energy beam emission end of the projection optical system.

28. An exposure method according to claim 27, wherein the piping mouth is disposed on a stage that supports the substrate.

29. An exposure method according to claim 27, wherein the light absorbing substance is an oxygen or an organic substance.

30. An exposure apparatus for transferring a pattern of a mask onto a substrate via a projection optical system using an energy beam, the exposure apparatus comprising a piping mouth that moves together with the substrate and removes a light absorbing substance that absorbs the energy beam from a periphery of the substrate so as to maintain a condition under which the energy beam can be transmitted through a space between the substrate and an energy beam emitting end portion of the projection optical system.

31. An exposure apparatus according to claim 30, wherein the piping mouth is disposed on a substrate stage that supports the substrate.

32. An exposure apparatus according to claim 30, wherein the light absorbing substance is an oxygen or an organic substance.

33. An exposure method for transferring a pattern of a mask onto a substrate via a projection optical system using an energy beam, the method comprising the steps of:
   removing a light absorbing substance that absorbs an energy of the energy beam from a space between the substrate and an energy beam emitting end portion of the projection optical system through which the energy beam should be transmitted when the substrate is exposed by the energy beam; and
   disposing an exhausting duct that has an exhausting mouth near the energy beam emitting end portion of the projection optical system instead of the substrate when the substrate is moved or exchanged so as to exhaust the light absorbing substance via the exhausting mouth.

34. An exposure apparatus for transferring a pattern of a mask onto a substrate via a projection optical system using an energy beam, the exposure apparatus comprising an exhausting duct that has an exhausting mouth that exhausts a light absorbing substance near an energy beam emitting end portion of the projection optical system so as to maintain a condition under which the light absorbing substance that absorbs the energy of the energy beam near the energy beam emitting end portion of the projection optical system not only when the substrate is exposed by the energy beam but also when the substrate is moved or exchanged.

35. A method for manufacturing a device comprising:
   an exposure step;
   a developing step;
   a pattern forming step;
   a bonding step;
   a packaging step; and
   a transcribing step that transcribes a device pattern formed on a mask onto the substrate by the exposure method of claim 1.

* * * * *